United States Patent
Takeuchi et al.

(10) Patent No.: US 6,787,824 B2
(45) Date of Patent: Sep. 7, 2004

(54) SOLID-STATE IMAGE PICK-UP DEVICE

(75) Inventors: Yutaka Takeuchi, Miyagi (JP);
Katsuhiro Shibata, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/464,730

(22) Filed: Jun. 19, 2003

(65) Prior Publication Data

US 2003/0234410 A1 Dec. 25, 2003

(30) Foreign Application Priority Data

Jun. 21, 2002 (JP) .................................. P.2002-181353

(51) Int. Cl.[7] .............................................. H01L 29/80
(52) U.S. Cl. ...................... 257/258; 257/290; 257/291; 257/294; 257/443; 257/257; 438/48
(58) Field of Search ................................ 257/136, 257, 257/258, 262, 290–294, 443–448, 911; 438/48; 348/296, 300, 301, 307, 308

(56) References Cited

U.S. PATENT DOCUMENTS 6,046,466 A 4/2000 Ishida et al.
6,605,850 B1 * 8/2003 Kochi et al. ............... 257/431
2002/0079491 A1 * 6/2002 Raynor ......................... 257/59

FOREIGN PATENT DOCUMENTS

JP   11-177073 A   7/1999

* cited by examiner

*Primary Examiner*—David Nelms
*Assistant Examiner*—Andy Huynh
(74) *Attorney, Agent, or Firm*—Birch, Stewart, Kolasch & Birch, LLP

(57) ABSTRACT

In a solid-state image pick-up device 10 in which a microlens layer 16 is provided on a surface of a semiconductor substrate 11 having photoelectric converting units 12H and 12L for storing an electric charge corresponding to an amount of incident light arranged vertically and horizontally, a microlens 16H to be provided on the microlens layer 16 is disposed on only the photoelectric converting unit 12H to be used as a pixel having a high sensitivity and the microlens layer 16 in a position facing the photoelectric converting unit 12L to be used as a residual pixel having a low sensitivity has a planar structure 16L or a perforated structure 16L.

5 Claims, 4 Drawing Sheets

SOLID-STATE IMAGE PICK-UP DEVICE

BACKGROUND OF THE INVENTION

1. Field of the Invention

The present invention relates to a solid-state image pick-up device such as a CCD, and more particularly to a solid-state image pick-up device having a wide dynamic range in which a pixel having a high sensitivity and a pixel having a low sensitivity are arranged.

2. Description of the Related Art

In a solid-state image pick-up device such as a CCD, a large number of photoelectric converting units (which will be hereinafter referred to as photodiodes) such as minute photodiodes for storing an electric charge corresponding to an amount of incident light are arranged vertically and horizontally and the electric charge stored in each of the photodiodes is read to reproduce the image of light formed on the surface of the solid-state image pick-up device in response to an electric signal.

However, there is a problem in that the photodiode constituting each pixel of the solid-state image pick-up device has a certain amount of saturation charges so that electric charges that is beyond the constant amount of incident light cannot be stored, by which a dynamic range becomes small. For this reason, there has been made a trial in which both a pixel having a low sensitivity and a pixel having a high sensitivity are arranged in the solid-state image pick-up device to enlarge the dynamic range.

FIG. 5 is a typical sectional view showing a conventional solid-state image pick-up device. In FIG. 5, a result obtained by simulating the degree of the refraction of an incident ray is shown together. A large number of minute photodiodes 2H and 2L are alternately arranged vertically and horizontally on a silicon substrate 1, and the photodiode 2H is used as a pixel having a high sensitivity and the photodiode 2L is used as a pixel having a low sensitivity. An electrode 3 for transferring an electric charge stored in each pixel and a shielding film 4 covering the electrode 3 are provided on the surface of the silicon substrate 1.

A color filter layer 5 and a microlens layer 6 are provided on the silicon substrate 1. A microlens 6H for a pixel having a high sensitivity and a large area and a microlens 6L for a pixel having a low sensitivity and a small area are convexed over a microlens layer 6, and the microlens 6H for a pixel having a high sensitivity collects light incident on a large area in the photodiode 2H and the microlens 6L for a pixel having a low sensitivity collects light incident on a small area in the photodiode 2L. The microlens layer 6 having such a structure has been described in JP-A-11-177073, for example.

In recent years, the number of pixels of a solid-state image pick-up device reaches several millions and the microlens layer 6 to be mounted on the solid-state image pick-up device has also been finer. The microlens layer 6 is generally manufactured by a photoetching technique and it is necessary to change the thicknesses of the microlenses 6H and 6L in order to cause the focal lengths of the microlens 6H for a high sensitivity and the microlens 6L for a low sensitivity having different areas to be equal to each other. Therefore, there is a problem in that the manufacture cannot be carried out at a one-time photoetching step and the photoetching step is to be carried out many times, resulting in an increase in a manufacturing cost.

For this reason, conventionally, the manufacture is carried out by setting the thickness of the microlens 6H for a high sensitivity to be equal to that of the microlens 6L for a low sensitivity as shown in FIG. 6. To the contrary, the manufacture is carried out by setting the thickness of the microlens 6L for a low sensitivity to be equal to that of the microlens 6H for a high sensitivity as shown in FIG. 7. Thus, the manufacturing cost of the microlens layer 6 is reduced.

As in the simulation of a pencil of light in FIGS. 6 and 7, however, there is a problem in that a condensation efficiency into the photodiode 2H for a high sensitivity is reduced in FIG. 6 and a condensation efficiency into the photodiode 2L for a low sensitivity is reduced in FIG. 7, and the light incident on the solid-state image pick-up device cannot be distributed efficiently into the pixel for a high sensitivity and the pixel for a low sensitivity.

SUMMARY OF THE INVENTION

It is an object of the invention to provide a solid-state image pick-up device which can be manufactured at a low cost and can efficiently distribute incident light into a pixel for a high sensitivity and a pixel for a low sensitivity.

In order to attain the object, the invention provides a solid-state image pick-up device in which a microlens layer is provided on a surface side of a semiconductor substrate having photoelectric converting units for storing an electric charge corresponding to an amount of incident light arranged vertically and horizontally, wherein a microlens to be provided on the microlens layer is disposed on only the photoelectric converting unit to be used as a pixel having a high sensitivity and the microlens layer in a position facing the photoelectric converting unit to be used as a residual pixel having a low sensitivity has a planar or perforated structure.

By this structure, the incident light can be distributed efficiently into each of the photoelectric converting units having the pixel for a high sensitivity and the pixel for a low sensitivity, and the incidence efficiency of the light incident on each photoelectric converting unit can be enhanced, and furthermore, the microlens layer can be manufactured at a low cost.

In the foregoing, it is preferable that a separate convex lens layer from the microlens layer which is provided with a convex lens for collecting, into the photoelectric converting unit, light incident on the photoelectric converting unit to be used as at least the pixel having a low sensitivity should be interposed between the microlens layer and the semiconductor substrate. By this structure, the incidence efficiency of the light incident on the photoelectric converting unit to be used as the pixel for a low sensitivity can further be increased, and furthermore, the microlens layer and the convex lens layer can be manufactured at a low cost.

In the foregoing, furthermore, it is preferable that the convex lens of the convex lens layer should be provided to be convexed on the semiconductor substrate side and the convex lens of the convex lens layer should be provided to be convexed on the incident light side, and furthermore, the convex lens layers of the lower convex lens and the upper convex lens should be provided and interposed between the microlens layer and the semiconductor substrate. By this structure, it is possible to further reduce the manufacturing cost of the solid-state image pick-up device by utilizing the convex lens layer having a low manufacturing cost.

DESCRIPTION OF THE PREFERRED EMBODIMENTS

An embodiment of the invention will be described below with reference to the drawings.

Figure 1:
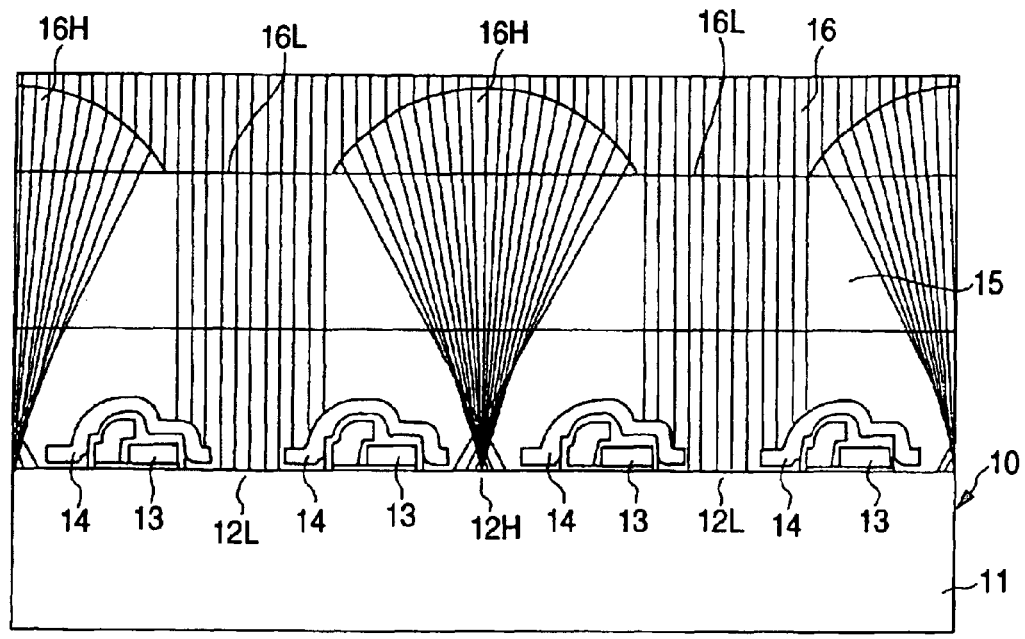
FIG. 1 is a typical sectional view showing a solid-state image pick-up device according to a first embodiment of the invention.

FIG. 1 is a typical sectional view showing a solid-state image pick-up device according to a first embodiment of the invention. In FIG. 1, a result obtained by simulating the degree of the refraction of an incident ray is shown together. A solid-state image pick-up device 10 is constituted by a semiconductor substrate 11, photodiodes 12H and 12L arranged vertically and horizontally on the semiconductor substrate 10 (a detailed structure thereof is not shown), an electrode 13 formed on the surface of the semiconductor substrate 11 and serving to transfer stored charges read from the photodiodes 12H and 12L, a shielding film 14 for shielding the electrode 13, a color filter layer 15 provided on the surface side of the semiconductor substrate 11, and a microlens layer 16 provided thereon.

Figure 5:
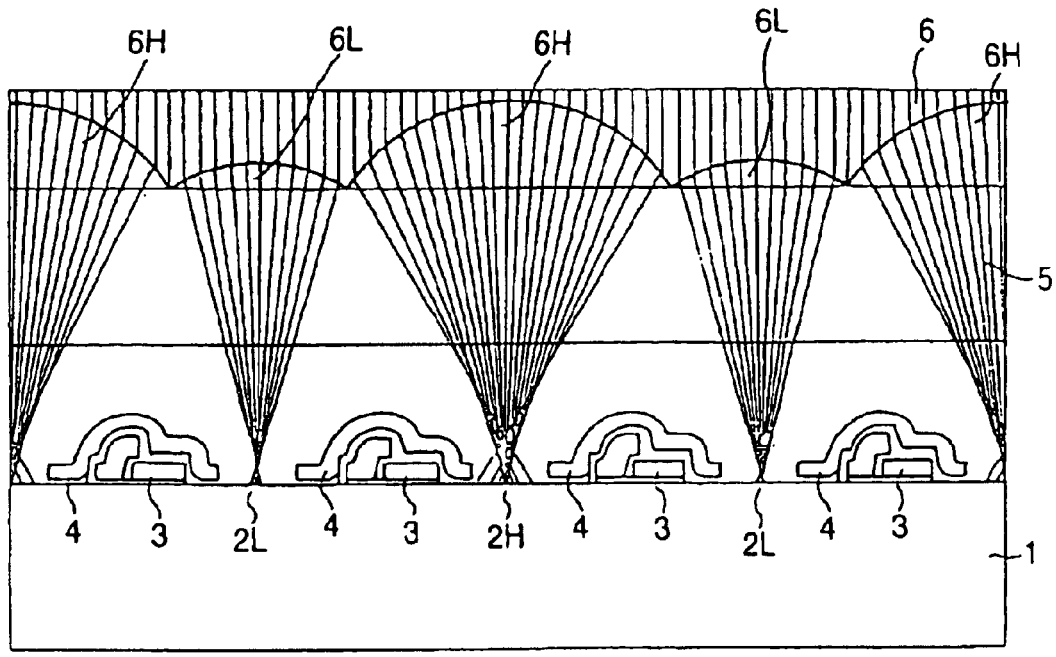
FIG. 5 is a typical sectional view showing a conventional solid-state image pick-up device.
Figure 6:
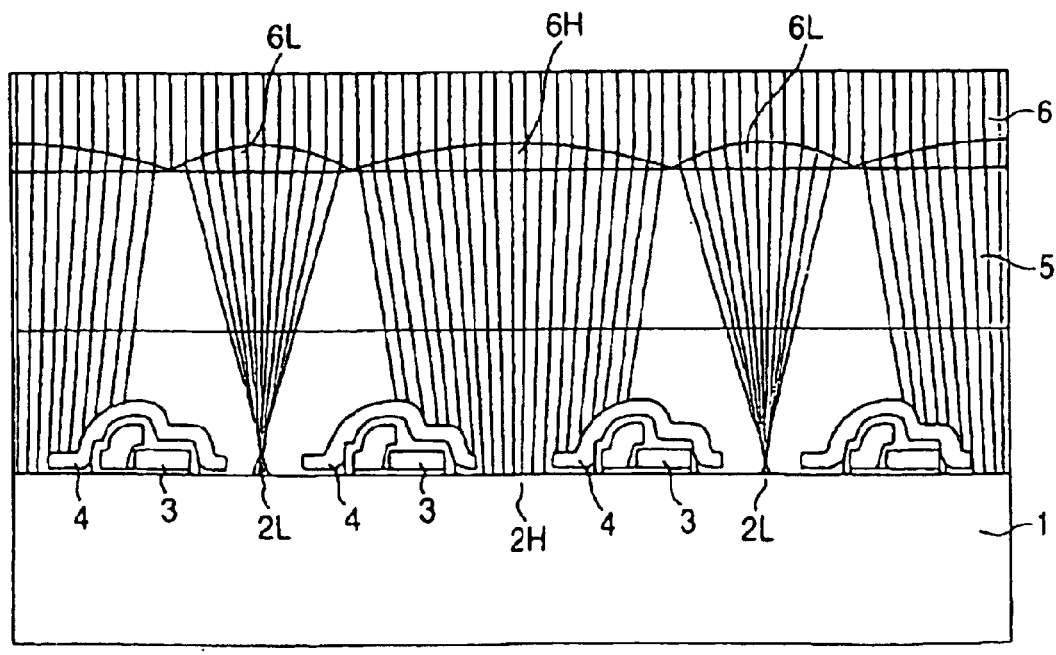
FIG. 6 is a typical sectional view showing another conventional solid-state image pick-up device.
Figure 7:
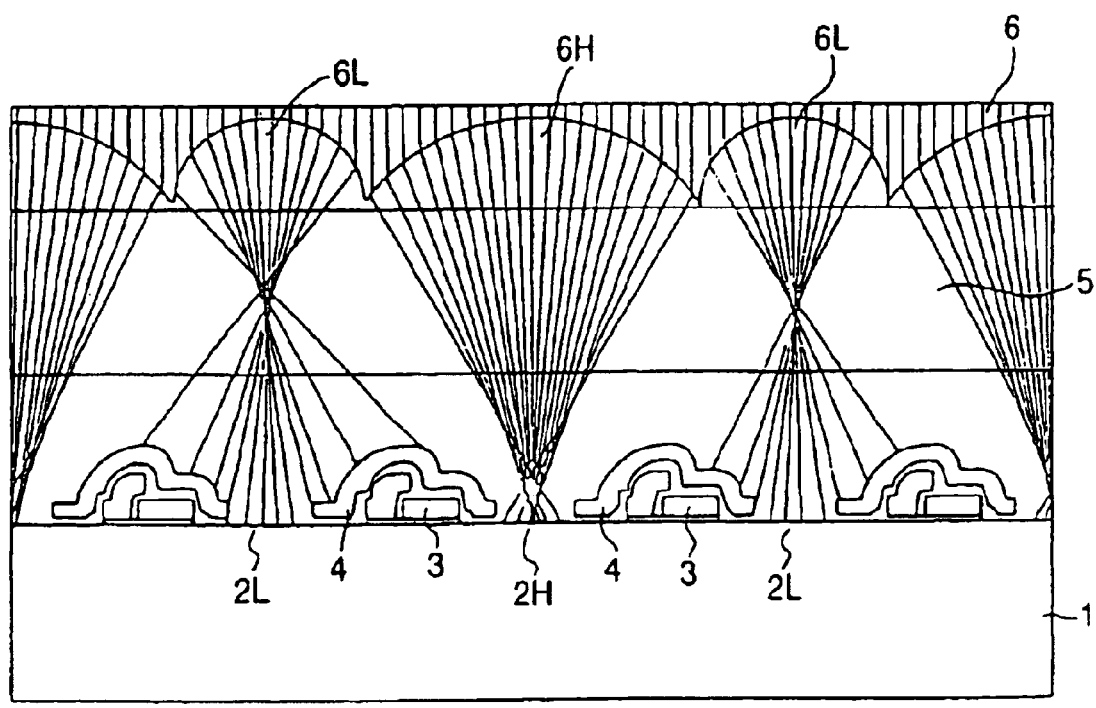
FIG. 7 is a typical sectional view showing a further conventional solid-state image pick-up device.

In the microlens layer 16 according to the embodiment, a microlens 16H for a pixel having a high sensitivity is formed in the upper position of the photodiode 12H in such a manner that an area is large and a condensing point is set into the position of the surface of the photodiode 12H. A small plane region 16L surrounded by the microlens 16H for a pixel having a high sensitivity (corresponding to a region in which a microlens 6L for a pixel having a low sensitivity is to be provided in FIGS. 5 to 7) is not provided with a lens and a parallel beam is exactly transmitted to reach the surface of the photodiode 16L. The plane region 16L may have such a structure that a hole is formed on the microlens layer 16.

In the solid-state image pick-up device 10 mounting the microlens layer 16, a light collected through the microlens 16H for a pixel having a high sensitivity is input to the photodiode 12H and an electric charge corresponding to the amount of the input light is stored. On the other hand, a light incident on the small region 16L surrounded by the microlens 16H is input to the photodiode 12L exactly straight and an electric charge corresponding to the amount of the input light is stored in the photodiode 12L.

In the embodiment, a microlens is not provided for the photodiode 12L and the region 16L surrounded by the microlens 16H for a high sensitivity which has a large area is small. Therefore, most of the light transmitted through the region 16L is incident on the photodiode 12L and a signal charge for an image having a low sensitivity can be stored efficiently in the photodiode 12L even if a microlens is not provided for collecting the light.

Figure 2:
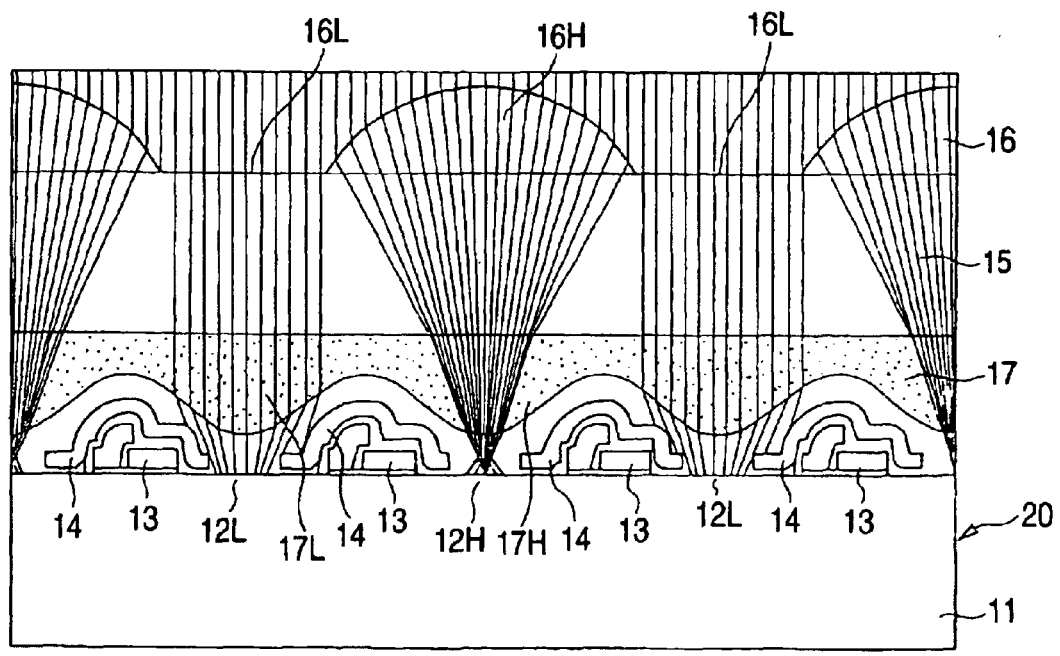
FIG. 2 is a typical sectional view showing a solid-state image pick-up device according to a second embodiment of the invention.

FIG. 2 is a typical sectional view showing a solid-state image pick-up device according to a second embodiment of the invention. A solid-state image pick-up device 20 according to the embodiment is different from the solid-state image pick-up device 10 according to the first embodiment in that a lower convex lens layer 17 is provided between the semiconductor substrate 11 and the color filter layer 15, and other structures are the same as those of the first embodiment.

The lower convex lens layer 17 is provided with convex lenses 17H and 17L turned in the directions of photodiodes 12H and 12L. The convex lenses 17H and 17L have thicknesses and diameters which are equal to each other. Therefore, the lower convex lens layer 17 can easily be manufactured. The convex lens 17H has a smaller diameter than the diameter of a microlens 16H having a large diameter. Since light collected by the microlens 16H is transmitted through the convex lens 17H, the convex lens 17H having a small diameter is enough.

By providing the lower convex lens layer 17, a parallel beam transmitted through a small region 16L surrounded by the microlens 16H for a pixel having a high sensitivity is collected by the convex lens 17L, and rarely collides against a surrounding shielding film 14 and is thus incident on the photodiode 12L. On the other hand, the light collected by the microlens 16H for a pixel having a high sensitivity is further collected by the convex lens 17H. Consequently, a luminous flux expands more greatly over the surface of the photodiode 12H as compared with that in FIG. 1. However, the luminous flux does not expand up to the outside of the photodiode 12H so that the incident light can be prevented from being useless.

It is also possible to employ such a structure that only the convex lens 17L is provided on the lower convex lens layer 17 and the convex lens 17H for a pixel having a high sensitivity is not provided.

Figure 3:
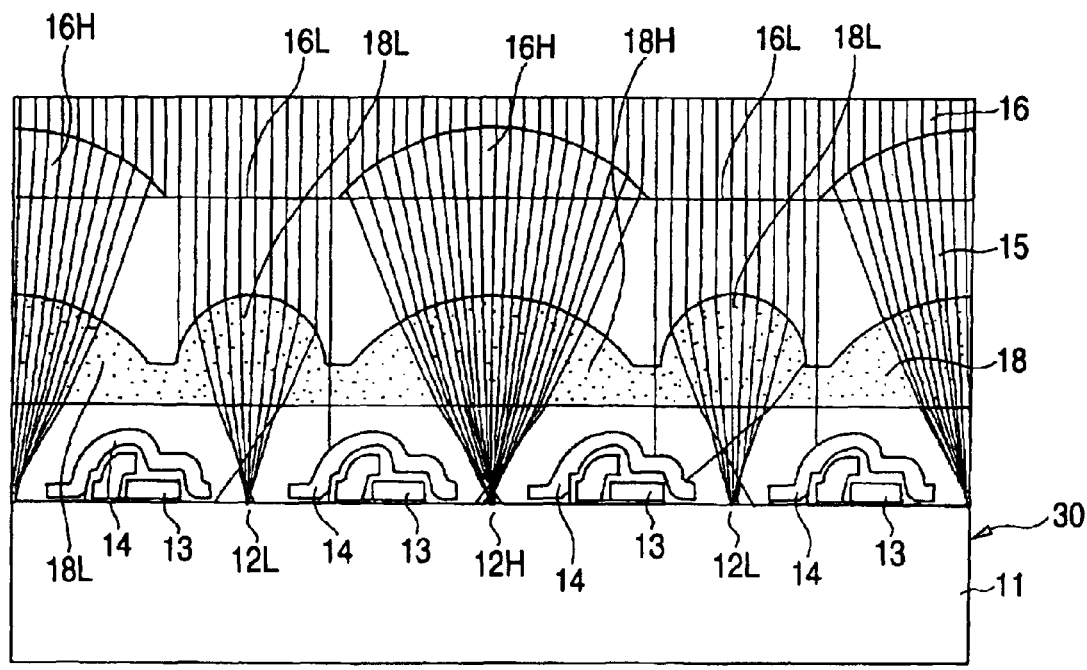
FIG. 3 is a typical sectional view showing a solid-state image pick-up device according to a third embodiment of the invention.

FIG. 3 is a typical sectional view showing a solid-state image pick-up device according to a third embodiment of the invention. A solid-state image pick-up device 30 according to the embodiment is different from the solid-state image pick-up device 20 according to the second embodiment in that an upper convex lens layer 18 is provided in place of the lower convex lens layer 17, and other structures are the same as those in the second embodiment.

In the upper convex lens layer 18, convex lenses 18H and 18L turned toward the incident light side are formed in positions corresponding to photodiodes 12H and 12L. Since the thicknesses of the convex lenses 18H and 18L are equal to each other, the upper convex lens layer 18 can easily be manufactured. The reason why the diameter of the convex lens 18H for a pixel having a high sensitivity of the upper convex lens layer 18 is set to be larger than the diameter of the convex lens 17H for a pixel having a high sensitivity of the lower convex lens layer 17 (FIG. 2) is that a distance between the surface of the convex lens 18H and a microlens 16H is small and light transmitted through the microlens 16H is to be always incident on the convex lens 18H.

By providing the upper convex lens layer 18, a parallel beam transmitted through a small region 16L surrounded by the microlens 16H for a pixel having a high sensitivity is collected by the convex lens 18L and is incident on the photodiode 12L without colliding against a surrounding shielding film 14. On the other hand, the light collected by the microlens 16H for a pixel having a high sensitivity is further collected by the convex lens 18H. In the same manner as in the second embodiment, consequently, a luminous flux expands over the surface of the photodiode 12H. However, the luminous flux does not expand up to the outside of the photodiode 12H so that the incident light can be prevented from being useless.

In the same manner as in the second embodiment, it is also possible to employ such a structure that only the convex lens 18L is provided on the upper convex lens layer 18 and the convex lens 18H for a pixel having a high sensitivity is not provided.

Figure 4:
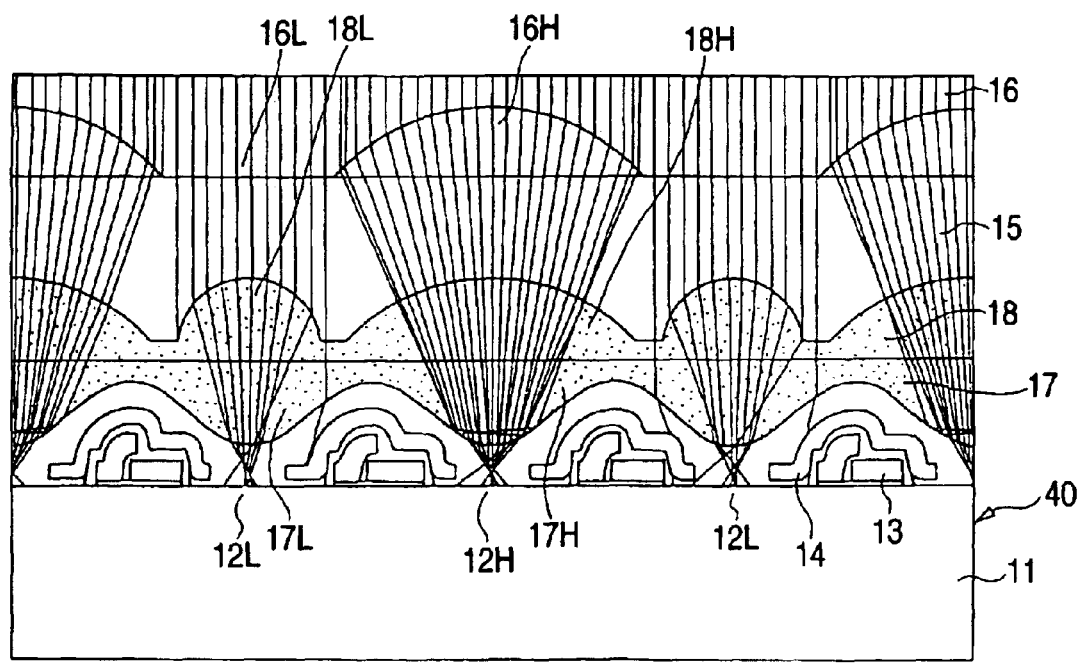
FIG. 4 is a typical sectional view showing a solid-state image pick-up device according to a fourth embodiment of the invention.

FIG. 4 is a typical sectional view showing a solid-state image pick-up device according to a fourth embodiment of the invention. A solid-state image pick-up device 40 according to the embodiment is different from the solid-state image pick-up device 10 according to the first embodiment in that the lower convex lens layer 17 according to the second embodiment and the upper convex lens layer 18 according to the third embodiment are superposed and interposed between the semiconductor substrate 11 and the color filter layer 15, and other structures are the same as those in the first embodiment.

The lower convex lens layer 17 is provided with convex lenses 17H and 17L turned toward photodiode 12H and 12L sides. Since the convex lenses 17H and 17L have thicknesses and diameters which are equal to each other, the lower convex lens layer 17 can easily be manufactured.

In the upper convex lens layer 18, the convex lenses 18H and 18L turned toward the incident light side are formed in positions corresponding to the photodiodes 12H and 12L. Since the convex lenses 18H and 18L have thicknesses equal to each other, the upper convex lens layer 18 can also be manufactured easily.

While the lower convex lens layer 17 and the upper convex lens layer 18 are manufactured separately and both of them are superposed and provided in the embodiment, the lower convex lens layer 17 and the upper convex lens layer 18 may be formed together over one sheet. Moreover, the convex lenses 17H and 18H may be omitted as described in the second and third embodiments.

By providing the lower convex lens layer 17 and the upper convex lens layer 18, a parallel beam transmitted through a small region 16L surrounded by a microlens 16H for a pixel having a high sensitivity is collected by the convex lenses 17L and 18L and is incident on the photodiode 12L without colliding against a surrounding shielding film 14.

According to each of the embodiments described above, the incidence efficiency of the light incident on each of the photodiode constituting a pixel for a high sensitivity and the photodiode constituting a pixel for a low sensitivity can be enhanced with a microlens structure at a low cost (the microlens layer 16 and the convex lens layers 17 and 18). Thus, it is possible to provide a high performance solid-state image pick-up device.

According to the invention, the structure of a microlens for distributing incident light into a pixel having a high sensitivity and a pixel having a low sensitivity can be manufactured at a low cost. Consequently, it is possible to inexpensively manufacture a solid-state image pick-up device having a pixel for a high sensitivity and a pixel for a low sensitivity.

What is claimed is:

1. A solid-state image pick-up device in which a microlens layer is provided on a surface side of a semiconductor substrate having photoelectric converting units for storing an electric charge corresponding to an amount of incident light, being arranged vertically and horizontally, wherein a microlens to be provided on the microlens layer is disposed above only the photoelectric converting unit to be used as a pixel of a high sensitivity, while the microlens layer in a position facing the photoelectric converting unit to be used as a residual pixel of a low sensitivity has a planar or perforated structure.

2. The solid-state image pick-up device according to claim 1, wherein a convex lens layer, being separated from the microlens layer, is provided with a convex lens for collection an incident light into the photoelectric converting unit, said incident light incoming to the photoelectric converting unit to be used for at least the pixel of a low sensitivity, said convex lens layer being interposed between the microlens layer and the semiconductor substrate.

3. The solid-state image pick-up device according to claim 2, wherein the convex lens of the convex lens layer is convex on the semiconductor substrate side.

4. The solid-state image pick-up device according to claim 2, wherein the convex lens of the convex lens layer is convex on the incident light side.

5. The solid-state image pick-up device according to claim 2, wherein the convex lens of the convex lens layer is convex on the semiconductor substrate side and the convex lens of the convex lens layer are interposed between the microlens layer and the semiconductor substrate.

* * * * *